United States Patent
Amirkhany et al.

(10) Patent No.: US 9,413,339 B2
(45) Date of Patent: Aug. 9, 2016

(54) APPARATUS AND METHOD FOR OFFSET CANCELLATION IN DUTY CYCLE CORRECTIONS

(71) Applicant: SAMSUNG DISPLAY CO., LTD., Yongin, Gyeonggi-Do (KR)

(72) Inventors: Amir Amirkhany, Sunnyvale, CA (US); Mohammad Hekmat, Mountain View, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 142 days.

(21) Appl. No.: 14/290,894

(22) Filed: May 29, 2014

(65) Prior Publication Data
US 2015/0097603 A1 Apr. 9, 2015

Related U.S. Application Data (60) Provisional application No. 61/886,574, filed on Oct. 3, 2013.

(51) Int. Cl.
*H03L 7/06* (2006.01)
*H03K 3/017* (2006.01)
*H03K 5/156* (2006.01)

(52) U.S. Cl.
CPC ............. *H03K 3/017* (2013.01); *H03K 5/1565* (2013.01)

(58) Field of Classification Search
None
See application file for complete search history.

(56) References Cited

U.S. PATENT DOCUMENTS

| | | | | |
|---|---|---|---|---|
| 4,527,075 | A * | 7/1985 | Zbinden | H03K 3/03 327/155 |
| 6,084,452 | A * | 7/2000 | Drost | H03K 5/1565 327/155 |
| 6,750,689 | B2 * | 6/2004 | Fletcher | H03K 5/1565 327/155 |

(Continued)

FOREIGN PATENT DOCUMENTS

WO WO 2013/101200 A1 7/2013

OTHER PUBLICATIONS

EPO Search Report dated Feb. 20, 2015, for corresponding European Patent application 14185883.7, (8 pages).

*Primary Examiner* — Lincoln Donovan
*Assistant Examiner* — Khareem E Almo
(74) *Attorney, Agent, or Firm* — Lewis Roca Rothgerber Christie LLP (57) ABSTRACT

An electronic device includes a clock configured to transmit a first clock signal and a second clock signal for operation of the electronic device; a duty cycle corrector coupled to the clock to correct a duty cycle of the first and second clock signals, the duty cycle corrector being configured to: assign and store a first duty cycle correction code in response to the first clock signal; assign and store a second duty cycle correction code in response to the second clock signal; calculate an offset code based on the first and second duty cycle correction codes; and negate the offset code from results of duty cycle correction operations.

20 Claims, 3 Drawing Sheets

(56) References Cited

U.S. PATENT DOCUMENTS

| | | | |
|---|---|---|---|
| 7,911,245 B2* | 3/2011 | Ma | G06F 1/06 327/144 |
| 7,940,103 B2* | 5/2011 | Satoh | H03K 5/1565 327/155 |
| 8,462,906 B1 | 6/2013 | Ding | |
| 2007/0146011 A1 | 6/2007 | O'Mahoney et al. | |
| 2010/0271889 A1* | 10/2010 | Lin | H03L 7/0812 365/194 |
| 2010/0329403 A1 | 12/2010 | Beukema et al. | |
| 2011/0164462 A1* | 7/2011 | Choi | G11C 7/22 365/194 |
| 2011/0291725 A1* | 12/2011 | Shin | G11C 7/22 327/175 |
| 2012/0194241 A1* | 8/2012 | Shin | H03L 7/07 327/158 |
| 2013/0154702 A1* | 6/2013 | Kim | H03L 7/089 327/158 |
| 2014/0203851 A1* | 7/2014 | Desai | H03K 5/1565 327/155 |
| 2015/0035570 A1* | 2/2015 | Hinrichs | H03K 5/00006 327/122 |
| 2015/0097603 A1* | 4/2015 | Amirkhany | H03K 5/1565 327/155 |

* cited by examiner

APPARATUS AND METHOD FOR OFFSET CANCELLATION IN DUTY CYCLE CORRECTIONS

CROSS-REFERENCE TO RELATED APPLICATIONS

This patent application claims the priority to and the benefit of U.S. Provisional Application Ser. No. 61/886,574, filed Oct. 3, 2013, titled "An Offset Cancellation Technique for Duty Cycle Correction Loops," the entire content of which is incorporated herein by reference.

BACKGROUND

1. Field

Embodiments of the present invention relate to an apparatus and a method for offset cancellation in duty cycle corrections.

2. Related Art

Electronic devices are ubiquitous. Many of these devices rely on internal clocks to synchronize and trigger transmission of data to coordinate the actions of circuits within the electronic devices. These devices may further utilize communication data links with a half-rate clock, that is, these devices may have a double data rate (e.g., circuits using the clock signal for synchronization may become active at both the rising and the falling edges of the clock cycle.).

However, in electronic devices that utilize double data rate systems, duty cycle error may occur. Duty cycle error occurs when a duty cycle of a clock signal within a period deviates from an ideal clock period (e.g., an ideal clock period having 50% duty cycle where the clock is a high signal for 50% of the period and a low signal for 50% of the period). This duty cycle error may consequently reduce timing margins of double data rate systems, and may cause degradation of performance.

Consequently, duty cycle correction circuits have been developed to mitigate clock duty cycle error. However, duty cycle correction circuits may introduce an additional intrinsic offset that is indistinguishable from actual duty cycle error. Accordingly, the offset produced by the duty cycle correction circuits hinder achievable duty cycle correction.

SUMMARY

Embodiments of the present invention provide an apparatus and method for duty cycle correction or compensation that compensates for the intrinsic offset associated with duty cycle correction circuits, thereby increasing the duty cycle correction circuits' ability to accurately mitigate duty cycle error.

According to one embodiment of the present invention, there is provided an electronic device including: a clock configured to transmit a first clock signal and a second clock signal for operation of the electronic device; a duty cycle corrector coupled to the clock to correct a duty cycle of the first and second clock signals, the duty cycle corrector being configured to: assign and store a first duty cycle correction code in response to the first clock signal; assign and store a second duty cycle correction code in response to the second clock signal; calculate an offset code based on the first and second duty cycle correction codes; and negate the offset code from results of duty cycle correction operations.

The duty cycle corrector may be further configured to calculate the offset code by averaging the first and second duty cycle correction codes.

The electronic device may further include a multiplexer coupled between the clock and the duty cycle corrector, the multiplexer being configured to selectively output the first clock signal or the second clock signal.

The electronic device may further include a finite state machine configured to control the multiplexer to sequentially output the first clock signal and the second clock signal to the duty cycle corrector.

The clock may be further configured to retransmit the first and second clock signals.

The duty cycle corrector may be further configured to: assign and store a third duty cycle correction code in response to the retransmitted first clock signal; assign and store a fourth duty cycle correction code in response to the retransmitted second clock signal; average the first and third duty cycle correction codes to obtain a first averaged duty cycle correction code; average the second and fourth duty cycle correction codes to obtain a second averaged duty cycle correction code; and calculate the offset code based on the first and second averaged duty cycle correction codes.

The duty cycle corrector may be further configured to calculate the offset code by averaging the first and second averaged duty cycle correction codes.

The electronic device may further include a finite state machine, wherein the finite state machine is configured to store therein a plurality of duty cycle correction codes corresponding to respective magnitudes of duty cycle correction.

A relationship between the plurality of the duty cycle correction codes and the magnitudes of duty cycle correction may be linear.

The first clock signal may be a complement of the second clock signal.

According to another embodiment of the present invention, there is provided a method of compensating for offset of a duty cycle correction loop, the method including: transmitting a first clock signal to a duty cycle corrector; transmitting a second clock signal to the duty cycle corrector; assigning and storing a first duty cycle correction code in response to the first clock signal; assigning and storing a second duty cycle correction code in response to the second clock signal; calculating an offset code based on the first and second duty cycle correction codes; and negating the offset code from results of duty cycle correction operations.

The calculating the offset code may include averaging the first and second duty cycle correction codes.

The transmitting the first and second clock signals may include selectively transmitting the first clock signal or the second clock signal.

The transmitting the first and second clock signals may include sequentially outputting the first clock signal and the second clock signal to the duty cycle corrector.

The method may further include: retransmitting the first clock signal; retransmitting the second clock signal; assigning and storing a third duty cycle correction code in response to the retransmitted first clock signal; assigning and storing a fourth duty cycle correction code in response to the retransmitted second clock signal; averaging the first and third duty cycle correction codes to obtain a first averaged duty cycle correction code; averaging the second and fourth duty cycle correction codes to obtain a second averaged duty cycle correction code; and calculating the offset code based on the first and second averaged duty cycle correction codes.

The calculating the offset code may include averaging the first and second averaged duty cycle correction codes.

A finite state machine may be configured to store therein a plurality of duty cycle correction codes corresponding to respective magnitudes of duty cycle correction.

A relationship between the plurality of the duty cycle correction codes and the magnitudes of duty cycle correction may be linear with respect to a mid-point.

The first clock signal may be a complement of the second clock signal.

The method may be performed in an electronic device and be repeated periodically during operation of the electronic device.

BRIEF DESCRIPTION OF THE DRAWINGS

The above and other aspects of embodiments of the present invention will become more apparent by describing in detail example embodiments thereof with reference to the accompanying drawings, in which.

DETAILED DESCRIPTION

Hereinafter, embodiments of the present invention will be described more fully with reference to the accompanying drawings, in which, exemplary embodiments of the present invention are shown. As those skilled in the art would realize, the described embodiments are susceptible to various modifications and alternative forms without departing from the spirit or scope of the present invention. For clarity of the description of the present invention, some elements or features not required for the complete understanding of the present invention may be omitted.

The terms used in the present specification are used to describe particular embodiments, and are not intended to limit the present invention. For example, it will be understood that, although the terms "first," "second," etc. may be used herein to describe various elements, these elements would not be limited by the strict construction of these terms. Instead, these terms are used only to distinguish one component from another. Further, an expression used in the singular encompasses the expression of the plural, unless it has a clearly different meaning in the context. In the present specification, it is to be understood that the terms such as "comprising," "including," "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when an element or layer is referred to as being "on," "connected to," or "coupled to" another element or layer, it can be directly on, connected to, or coupled to the other element or layer, or one or more intervening elements or layers may also be present. When an element is referred to as being "directly on," "directly connected to", or "directly coupled to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" or "over" the other elements or features. Thus, the exemplary term "below" may encompass both an orientation of above and below. The device may be otherwise oriented (e.g., rotated 90 degrees or at other orientations) and the spatially relative descriptors used herein should be interpreted accordingly.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Further, when describing embodiments of the present invention, the use of "may" relates to "one or more embodiments of the present invention."

Like reference numerals in the drawings denote like elements, and repeated descriptions thereof may be omitted.

Figure 1:
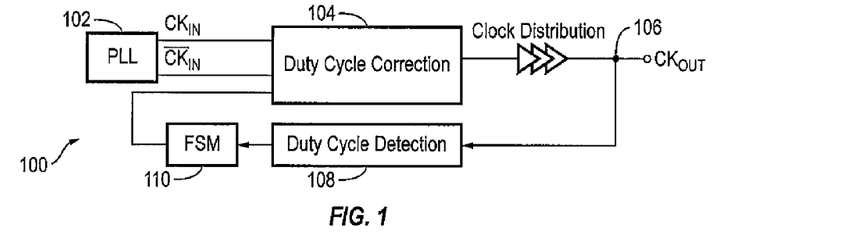
FIG. 1 is a schematic diagram illustrating a duty cycle correction loop.

FIG. 1 is a schematic diagram illustrating a duty cycle correction loop.

Referring to FIG. 1, a typical duty cycle correction loop 100 may include a phase-locked loop (PLL) 102 as a clock source. However, embodiments of the present invention are not limited to including a PLL, as other suitable clock sources may be used as known to those skilled in the art. The phase-locked loop 102 may be configured to generate a clock signal $CK_{IN}$ and a complementary clock signal $/CK_{IN}$. The clock signals are transmitted to a duty cycle corrector (Duty Cycle Correction) 104 which performs the operation of correcting the duty cycle error, which the clock signals exhibit, by shifting the clock signal to its ideal duty cycle. For example, the duty cycle corrector 104 may adjust an incoming clock signal having a 60% duty cycle to an ideal duty cycle or ideal clock period of 50%. More details regarding the duty cycle corrector 104 are disclosed below. After the duty cycle corrector 104 adjusts the clock signal, the clock signal is distributed (Clock Distribution) (e.g., distributed to circuits in an electronic device that utilize the clock signal to function) and output as $CK_{OUT}$.

Concurrently, the output of the duty cycle corrector 104 is sampled and input to the duty cycle detector (Duty Cycle Detection) 108 at a point before the point of use 106. The duty cycle detector 108 performs the operation of detecting the duty cycle of the clock signal that has been adjusted by the duty cycle corrector 104 (e.g., the duty cycle detector 108 calculates the duty cycle error of the clock signal). In some embodiments of the present invention, the output of the duty cycle corrector 104 is sampled and transmitted to a replica of the clock distribution, and then the output of the replica clock distribution is sent to the duty cycle detector 108. More details regarding the duty cycle detector 108 are disclosed below.

After the duty cycle detector 108 performs the detecting operation, its output is transmitted to a finite state machine (FSM) 110. The finite state machine 110 controls the operation of the duty cycle corrector 104 based on the results of the duty cycle error detecting operation performed by the duty cycle detector 108. Accordingly, a feedback loop is formed at the point where the duty cycle corrector 104 outputs a corrected clock signal, and the corrected clock signal is transmitted to the duty cycle detector 108 to determine a detected duty cycle signal that is supplied to the finite state machine 110, and the finite state machine outputs control signals to the duty cycle corrector 104, thereby completing the loop.

Typical duty cycle correction loops are not limited to that shown in FIG. 1, as duty cycle correction loops may include various modified configurations.

Figure 2:
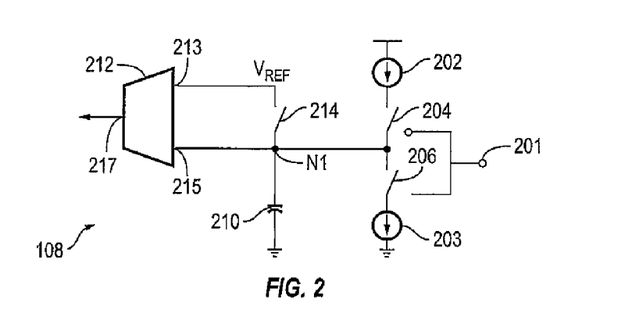
FIG. 2 is a schematic diagram of the duty cycle detector of the duty cycle correction loop shown in FIG. 1.

FIG. 2 is a schematic diagram of the duty cycle detector 108 of the duty cycle correction loop shown in FIG. 1.

The duty cycle detector 108 functions by utilizing an integrator. In other words, the duty cycle detector 108 averages the incoming clock signal over a period of time (e.g., over one period of the clock). Thus, for example, when the duty cycle of the clock signal is 50% (e.g., half of a period of the clock signal is a high signal, and the other half of the period of the clock signal is a low signal), the integration of the clock signal over the clock period is 0. However, when the duty cycle is not 50%, the integration operation yields a non-zero number, which indicates that duty cycle error exists.

Referring to FIG. 2, the duty cycle detector 108 includes a first current source 202 and a second current source 203, a first switch 204 coupled between the first current source 202 and a node N1, a second switch 206 coupled between the node N1 and the second current source 203, and a capacitor 210 coupled between ground and the node N1.

The first switch 204 and the second switch 206 may be complementary to each other, that is, the first switch 204 may close in response to a low signal, and the second switch 206 may close in response to a high signal, as illustrated in FIG. 2. The capacitor 210 may be a polarized capacitor. The integrating element of the duty cycle detector 108 is the capacitor 210. The first current source 202 is switchably coupled to the node N1 via the first switch 204, and the second current source 203 is switchably coupled to the node N1 via the second switch 206. The capacitor 210 is further coupled to reset switch 214 at the node N1. The reset switch 214 is configured to switchably couple the capacitor 210 to reference voltage $V_{REF}$. $V_{REF}$ may be any suitable reference voltage, such as, for example, a DC voltage.

In embodiments of the present invention, $V_{REF}$ is an initial voltage that provides the common-mode for proper operation of the comparator. Since the comparator is a differential circuit, it detects the difference between the inputs. In some embodiments of the present invention, N1 is first initialized to $V_{REF}$, and then the integration performed by the duty cycle detection circuit modifies the voltage level of N1 such that the comparator is able to extract duty cycle error. The $V_{REF}$ voltage value may depend on the implementation of the feedback amplifier (e.g., it can be half the supply value). In some embodiments of the present invention, the second current source is nominally the same or similar as the first current source, with the difference being the direction of the respective currents.

The duty cycle detector 108 further includes a comparator 212. The comparator 212 includes a first input terminal 213, a second input terminal 215, and an output terminal 217. The first input terminal 213 is coupled to $V_{REF}$ as the reference voltage. The second input terminal 215 is coupled to the node N1, and is also coupled to the capacitor 210. As such, an operation of the comparator 212 includes a comparison of the voltage of the capacitor 210, which is supplied to the second input terminal 215, with the reference voltage $V_{REF}$, which is supplied to the first input terminal 213. Furthermore, based on this comparison, the comparator 212 is configured to output at the output terminal 217 a result that is dependent on whether the voltage of the capacitor 210 is greater than or less than the reference voltage $V_{REF}$ (e.g., the comparator may output a 0 when the voltage of the capacitor 210 is less than the reference voltage $V_{REF}$, and may output a 1 when the voltage of the capacitor 210 is less than the reference voltage $V_{REF}$). The output of the comparator 212 is transmitted to the finite state machine 110 shown in FIG. 1.

Referring to the operation of the duty cycle detector 108, the reset switch 214 may be first closed to electrically couple the capacitor 210 to $V_{REF}$ so as to initialize the capacitor 210 with the reference voltage $V_{REF}$. Then, the duty cycle detector 108 samples the corrected clock signal that is supplied from the duty cycle corrector 104 at input terminal 201. In the present example, when the sampled clock signal is a low signal, the first switch 204 is closed such that the current source 202 supplies current to the capacitor 210, thereby increasing or charging the voltage of the capacitor 210. When the sampled clock signal is a high signal, the second switch 206 is closed such that the capacitor 210 is coupled to the second current source 203, and the capacitor 210 is therefore discharged. Other examples of duty cycle detectors may have an opposite configuration (e.g., the first switch 204 closes in response to a low clock signal, and the second switch 206 closes in response to a high clock signal). In these other examples, the other components of the duty cycle detector 108 and the duty cycle correction loop may be suitably configured according to the modified switching configuration (e.g., the comparator 212 and the finite state machine 110 may be configured accordingly).

Furthermore, the comparator 212 may continuously sample the voltage of the capacitor 210 at the second input terminal 215. Because the reference voltage $V_{REF}$ is supplied to the first input terminal 213 of the comparator 212, the comparator 212 continuously compares the value of the voltage of the capacitor 210 with the value of the reference voltage $V_{REF}$. As such, the comparator 212 is able to continuously supply a result of the comparison to the finite state machine 110. As an example, when the voltage of the capacitor 210 is greater than the reference voltage $V_{REF}$, the comparator may supply a 1 bit (e.g., a high signal) to the finite state machine 110, and when the voltage of the capacitor 210 is less than the reference voltage $V_{REF}$, the comparator may supply a 0 bit (e.g., a low signal) to the finite state machine 110. Other examples of duty cycle detectors may supply the opposite bits (e.g., a 0 bit when the capacitor voltage is greater than $V_{REF}$, and a 1 bit when the capacitor voltage is less than $V_{REF}$). The finite state machine 110 may accordingly control the duty cycle corrector 104 to adjust the duty cycle of the clock signal based on the results of the duty cycle detector 108, such that the duty cycle is at, or is close to, the ideal clock signal period (e.g., 50% duty cycle).

By way of example of the operation of the duty cycle detector 108 illustrated in FIG. 2, when the duty cycle of the clock signal is greater than 50%, the capacitor 210, which has been initialized with the reference voltage $V_{REF}$, discharges longer than it charges because the clock signal is high for greater than 50% of a clock period. Accordingly, the second switch 206 is closed for greater than 50% of the clock period, thereby discharging the capacitor 210 for greater than 50% of the clock period, such that the voltage of the capacitor 210 is less than $V_{REF}$. Accordingly, in such a scenario, the comparator 212 outputs a result signal (e.g., a bit) to the finite state machine 110 corresponding to when the voltage of the capacitor 210 is less than $V_{REF}$, and in response to this signal/bit, the finite state machine 110 directs the duty cycle corrector 104 to decrease the duty cycle.

On the other hand, when the duty cycle of the clock signal is less than 50%, the capacitor is charged longer than it is discharged because the clock signal is low for greater than 50% of a clock period. Accordingly, the first switch 204 is closed for greater than 50% of the clock period, thereby charging the capacitor 210 for greater than 50% of the clock period such that the voltage of the capacitor 210 is greater than $V_{REF}$. Accordingly, the comparator 212 outputs a signal/result (e.g., a bit) corresponding to when the voltage of the capacitor 210 is greater than $V_{REF}$, the signal/result being different from the signal/result supplied by the comparator 212 when the capacitor 210 is less than $V_{REF}$, and in response to this different signal/result, the finite state machine 110 directs the duty cycle corrector 104 to increase the duty cycle.

The duty cycle detector 108 may ultimately reach a point where it detects the clock's duty cycle as being close to the ideal duty cycle (e.g., 50%). In this case, the voltage of the capacitor 210 may alternate between being greater than $V_{REF}$ and being lower than $V_{REF}$. Additionally, the duty cycle detection and correction operations may be a continuous operation (e.g., the duty cycle is continuously calibrated), or may be a periodic operation (e.g., the duty cycle is intermittently calibrated).

Typical duty cycle detectors (e.g., the duty cycle detector 108 illustrated in FIG. 2) utilize the feedback loop for duty cycle correction, where the clock signal is often sampled at the end of the clock distribution network such that the duty cycle is fixed at the point of use (e.g., at $CK_{OUT}$). Furthermore, the complementary clock /$CK_{IN}$ is typically available at the clock source (e.g., at the phase-locked loop), but not at the point of use. Also, as illustrated in FIG. 2 and as stated above, typical duty cycle detectors utilize an integrator (e.g., the capacitor 210) to measure duty cycle error. However, problems exist with the use of integrators, such as inherent integrator offset that may be caused by the up/down current mismatch (e.g., the mismatch between current source 202 and current source 203 shown in FIG. 2). For example, if current source 202 is slightly greater than current source 203 (i.e., there is a mismatch), the capacitor 210 charges at a greater rate than it discharges, even when the duty cycle is 50%, causing inaccuracy of duty cycle detection. Consequently, integrator offset may be indistinguishable from actual duty cycle error in typical duty cycle correction loops, and may become an obstacle to achieving duty cycle correction. Furthermore, integrator offset may become exacerbated across process, voltage, and temperature variations.

Typical duty cycle detectors are not limited to the duty cycle detector 108 shown in FIG. 2, as duty cycle detectors that utilize an integrator may include various modified configurations.

To overcome this problem of integrator offset as an impediment to duty cycle error correction, differential duty cycle correctors, which use an integrator for a clock signal and a separate integrator for a complementary clock signal, have been utilized. In differential duty cycle correctors, the result of the integrator associated with the clock and the result of the integrator associated with the complementary clock are subtracted to detect the duty cycle error independent of the integrator offset. However, there are multiple drawbacks to the use of differential duty cycle correctors. First, because there are two separate integrators, differential duty cycle correctors use almost double the area and power of typical duty cycle correction loops. Second, matching between the two integrators also becomes a source of offset that contributes to duty cycle error.

Figure 3:
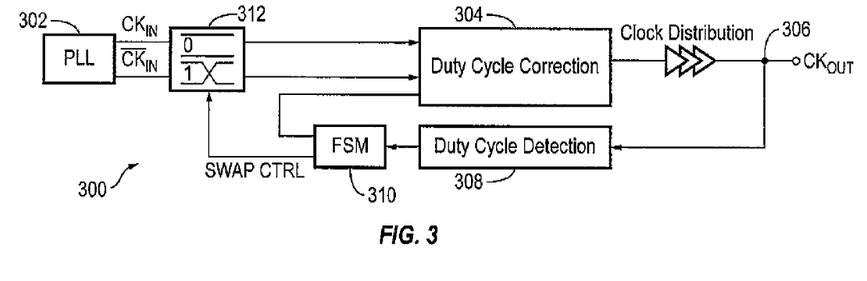
FIG. 3 is a schematic diagram illustrating a duty cycle correction loop, according to an embodiment of the present invention.

FIG. 3 is a schematic diagram illustrating a duty cycle correction loop according to an embodiment of the present invention.

Referring to FIG. 3, duty cycle correction loop 300 is similar to the duty cycle correction loop 100 shown in FIG. 1, except that it further includes a multiplexer 312. Therefore, description of similar elements may be omitted herein. The phase-locked loop (PLL) 302, which generates the clock signal $CK_{IN}$ and the complementary clock signal /$CK_{IN}$, is coupled to the multiplexer 312, which receives both the $CK_{IN}$ and /$CK_{IN}$ clock signals. The multiplexer is configured to select either the clock signal $CK_{IN}$ or the complementary clock signal /$CK_{IN}$ for transmission to the rest of the duty cycle correction loop 300. The finite state machine (FSM) 310 is coupled to the multiplexer 312 and accordingly controls the operation of the multiplexer 312 by supplying a control signal SWAP CTRL. For example, when the control signal SWAP CTRL is 0, the multiplexer 312 passes the clock signal (e.g., $CK_{IN}$), but when the control signal SWAP CTRL becomes 1, the multiplexer switches the output and passes the complementary clock signal (e.g., /$CK_{IN}$). Accordingly, the multiplexer may be programmed as follows:

if SWAP CTRL=1, then swap
else pass the signal through

As discussed above, the finite state machine 310 also controls the operation of the duty cycle corrector (Duty Cycle Correction) 304. The finite state machine 310 has stored therein a plurality of duty cycle correction codes (DCC codes) that correspond to set amounts or magnitudes of duty cycle correction (e.g., one DCC code may correspond to a 1% increase in duty cycle, and another DCC code may correspond to a 1% decrease in duty cycle). Based on results from the duty cycle detector 308, the finite state machine 310 controls the duty cycle corrector 304 to adjust the duty cycle of the clock signal $CK_{IN}$ by using the stored DCC codes. In embodiments of the present invention, the DCC codes may correspond to respective amounts or magnitudes of duty cycle correction in a symmetrical manner (e.g., a linear relationship, a symmetrical curve, etc.). More details regarding DCC codes are disclosed below.

According to embodiments of the present invention, the integrator offset of the duty cycle detector 308 may be calculated and utilized (e.g., subtracted, added, or negated) in subsequent duty cycle error adjustment operations of the duty cycle correction loop 300. According to the present embodiment, the integrator offset is calculated through two measurements of correction code, and then the offset calculation is digitally subtracted from duty cycle correction control codes. The two measurements of correction code are in response to a first clock signal (e.g., the clock signal) and a second clock signal (e.g., the complementary clock signal), which are available at the clock source (e.g., at phase-locked loop 302), in a sequential manner.

According to the present embodiment of the present invention, the phase-locked loop 302 generates the clock signal $CK_{IN}$ and the complementary clock signal /$CK_{IN}$, and supplies the two signals to the multiplexer 312. First, the multiplexer 312 passes the clock signal $CK_{IN}$ generated from the phase-locked loop 302 to the rest of the duty cycle correction loop 300 (e.g., to the duty cycle corrector 304, the clock distribution, the duty cycle detector 308, and the finite state machine 310). In some embodiments of the present invention, the duty cycle detector 308 is the duty cycle detector 108 shown in FIG. 2. However, the duty cycle detector 308 may be any suitable duty cycle detector utilizing an integrator to detect duty cycle error. After the clock signal $CK_{IN}$ travels through the duty cycle correction loop 300, a first offset code calculated based on the clock signal $CK_{IN}$ is stored in the finite state machine 310.

Then, the finite state machine 310 sends the control signal SWAP CTRL (e.g., SWAP CTRL=1) to the multiplexer 312, and the multiplexer 312 switches its output to pass through the complementary clock signal $/CK_{IN}$. Accordingly, the multiplexer 312 passes the complementary clock signal $/CK_{IN}$ generated from the phase-locked loop 302 to the rest of the duty cycle correction loop 300 (e.g., to the duty cycle corrector 304, the clock distribution, the duty cycle detector 308, and the finite state machine 310). After the complementary clock signal $/CK_{IN}$ travels through the duty cycle correction loop 300, a second offset code calculated based on the clock signal $/CK_{IN}$ is stored in the finite state machine 310.

Because the relationship between the DCC code and the duty cycle correction is symmetrical (e.g., linear), when there is no offset, the DCC code associated with $CK_{IN}$ (e.g., the first offset code) and the DCC code associated with $/CK_{IN}$ (e.g., the second offset code) will have a midpoint corresponding to no duty cycle correction (i.e., the average of the two offset codes is zero). Because there is no integrator offset, the duty cycle correction of the clock signals $/CK_{IN}$ and $CK_{IN}$ are simply complementary to each other and reflect the true duty cycle error. For example, the duty cycle of a clock period may be 55%, meaning that $CK_{IN}$ is 55% of the clock period and $/CK_{IN}$ is 45% of the clock period. Accordingly, to achieve a clock period having a duty cycle of 50%, the duty cycle may be adjusted by 5%, that is, $CK_{IN}$ may be adjusted by 5% (e.g., increased by 5%) and $/CK_{IN}$ may be adjusted by −5% (e.g., reduced by 5%). As such, the average of these two offset amounts, or offset magnitudes (e.g., 5% and −5%), equals 0, thereby indicating that there is no offset error.

However, in the instance when integrator offset is introduced to the duty cycle correction loop, the DCC codes associated with $CK_{IN}$ and $/CK_{IN}$ do not average to 0. For example, when integrator offset exists in a duty cycle correction loop, the amount of error associated with $CK_{IN}$ may be 9% and the amount of error associated with $/CK_{IN}$ may be −1%. In this case, integrator offset exists, and the average of the two offset codes associated with $CK_{IN}$ and $/CK_{IN}$ equals the amount of integrator offset inherent in the duty cycle correction loop. Accordingly, in embodiments of the present invention, the offset error may be calculated by averaging the two offset DCC codes and negating this amount of offset error from subsequent operations of duty cycle correction such that a more accurate duty cycle correction may be achieved.

The above-described process of calculating the integrator offset of a duty cycle correction loop may be performed periodically throughout the use of the loop, or may be performed at the beginning of operation of the electronic device utilizing the duty cycle correction loop.

In other embodiments of the present invention, a replica of the duty cycle correction loop 300 is manufactured in the electronic device in addition to the duty cycle correction loop 300. The replica duty cycle correction loop may be continuously operating duty cycle corrections. In this case, the non-replica duty cycle correction loop may use the DCC codes generated in the replica duty cycle correction loop to perform duty cycle correction. In some embodiments of the present invention, the replica duty cycle correction loop is a scaled version of the actual duty cycle correction loop (e.g., scaled by a factor of 2).

Figure 4A:
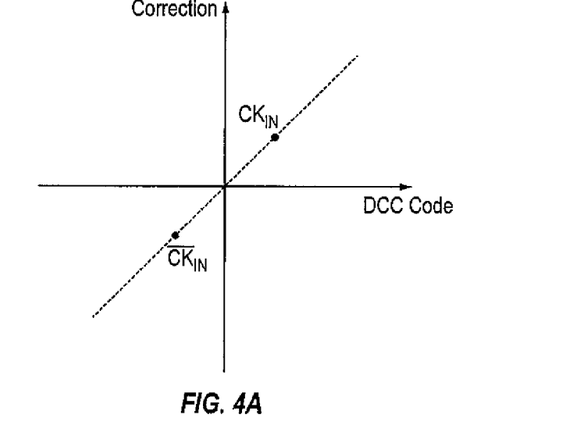
FIG. 4A is a graph illustrating duty cycle correction codes corresponding to respective magnitudes of duty cycle correction when no integrator offset exists, according to an embodiment of the present invention.

FIG. 4A is a graph illustrating duty cycle correction codes corresponding to respective magnitudes of duty cycle correction when no integrator offset exists according to an embodiment of the present invention.

Referring to FIG. 4A, the graph illustrates a relationship between the DCC codes and the amount of duty cycle correction according to embodiments of the present invention. In the present embodiment, the relationship is linear, that is, as the DCC code increases, the amount of duty cycle correction linearly increases. In this example, because there is no offset, the duty cycle error correction corresponding to $CK_{IN}$ and the duty cycle error correction corresponding to $/CK_{IN}$ is symmetrical around the midpoint of 0 (i.e., where the two axes intersect). In other embodiments of the present invention, the relationship may not be linear, as long as the relationship is symmetric with respect to a midpoint on the graph.

By way of example, the graph illustrated in FIG. 4A may include a DCC code of 1 that corresponds to 1% duty cycle correction, a DCC code of 2 that corresponds to 2% duty cycle correction, a DCC code of −1 that corresponds to −1% duty cycle correction, etc. Other embodiments of the present invention may provide other suitable symmetrical or linear relationships between the DCC code and the amount of duty cycle correction. In embodiments of the present invention, the DCC codes are stored in the finite state machine 310.

Figure 4B:
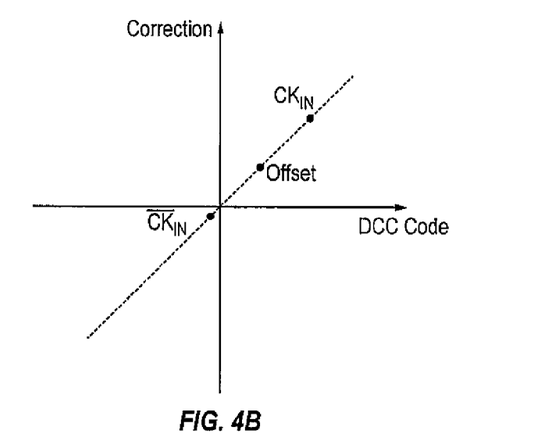
FIG. 4B is a graph illustrating duty cycle correction codes corresponding to respective magnitudes of duty cycle correction when integrator offset exists, according to an embodiment of the present invention.

FIG. 4B is a graph illustrating duty cycle correction codes corresponding to respective magnitudes of duty cycle correction when integrator offset exists, according to an embodiment of the present invention.

Referring to FIG. 4B, the graph also illustrates the linear relationship between the DCC codes and the amount of duty cycle correction. However, a difference between FIG. 4B and FIG. 4A is that FIG. 4B illustrates an integrator offset introduced into the duty cycle correction loop. As illustrated, the integrator offset causes the linear graph to shift as a whole, as the offset affects both the clock signal $CK_{IN}$ and the complementary clock signal $/CK_{IN}$ in the same way (i.e., shifts them the same amount, or to the same degree). In particular, the data points corresponding to the clock signal $CK_{IN}$ and to the complementary clock signal $/CK_{IN}$ are no longer symmetrical about the origin of the graph. Accordingly, with this offset, the duty cycle corrector would otherwise proceed to incorrectly adjust the duty cycle of clock signals.

However, according to embodiments of the present invention, after transmitting the clock signal $CK_{IN}$ and the complementary clock signal $/CK_{IN}$, the offset may be determined, as it may be identified as the midpoint between the data point corresponding to the clock signal $CK_{IN}$ and the data point corresponding to the complementary clock signal $/CK_{IN}$. In other words, the offset may be calculated by averaging the DCC code corresponding to $CK_{IN}$ and the DCC code corresponding to $/CK_{IN}$. Accordingly, this calculated offset may be subtracted or added, depending on whether the offset is positive or negative, from or to subsequent duty cycle correction calculations to obtain accurate duty cycle corrections by negating the integrator offset from these calculations. The subtracting (or adding) of the offset may occur at the finite state machine, according to embodiments of the present invention.

Accordingly, embodiments of the present invention provide an apparatus and a method for offset cancellation in duty cycle correction loops that have increased accuracy in correcting duty cycle error. Furthermore, embodiments of the present invention may be implemented digitally, resulting in portability and scalability. Although duty cycle correction loops according to embodiments of the present invention have been described as operating in the digital domain, embodiments of the present invention may also be extended to applications in the analog domain, with minor modifications. Moreover, in comparison to differential duty cycle correctors, use of power and area is decreased by embodiments of the present invention. Additionally, embodiments of the present invention relax matching requirements of current sources in the duty cycle detector.

Figure 5:
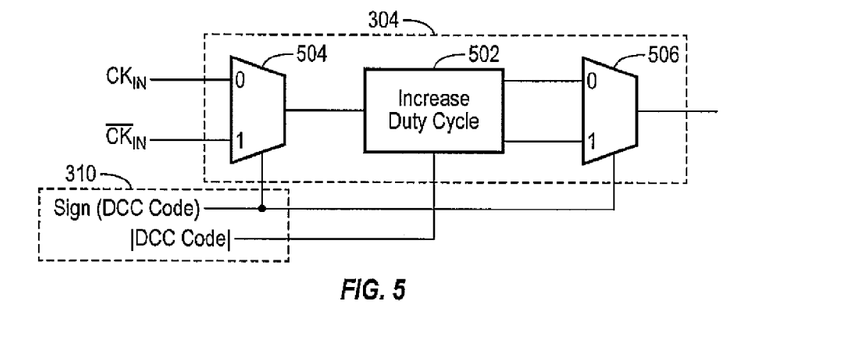
FIG. 5 is a schematic diagram illustrating the duty cycle corrector shown in FIG. 3.

FIG. 5 is a schematic diagram illustrating the duty cycle corrector shown in FIG. 3.

Referring to FIG. 5, the duty cycle corrector 304 includes a circuit 502, which increases a duty cycle of a clock signal, a first multiplexer 504, and a second multiplexer 506. The circuit 502 is configured to receive an absolute value of the DCC codes from the finite state machine 310. The first multiplexer 504 and the second multiplexer 506 are configured to receive sign signals of the DCC codes from the finite state machine 310.

Embodiments of the present invention rely on the relationship between duty cycle code and the duty cycle correction being symmetric with respect to a midpoint. In some embodiments of the present invention the relationship is linear, and in other embodiments the relationship is non-linear but still symmetrical. According to the present embodiment, the duty cycle corrector 304 is configured to only increase the duty cycle. As such, in the case when a reduction of duty cycle is needed, the input may be inverted at 504.

For example, when the duty cycle is 45%, the circuit operates normally (e.g., without inverting the input) and increases the duty cycle to 50%. However, when the duty cycle is 55%, the input is inverted by the first multiplexer 504, which means that the duty cycle becomes 45% and the one-sided duty cycle corrector increases the inverted duty cycle to 50% at circuit 502. However, to negate the sign inversion introduced by the first multiplexer, a second multiplexer 506 is located after the duty cycle increasing circuit 502 because. The embodiment of the duty cycle corrector 304 according to FIG. 5 offers a solution for cases where the relationship between duty cycle code and the duty cycle correction is not necessarily linear.

The present embodiment of FIG. 5 is only one embodiment of a duty cycle corrector (e.g., an embodiment where the duty cycle corrector is configured to only increase the duty cycle). The present embodiment is simply a way to achieve symmetry, if needed. However, in other embodiments of the present invention, duty cycle correctors may be symmetric and thus may not use the embodiment shown in FIG. 5. Other embodiments of the present invention may include any other suitable duty cycle corrector, in accordance with aspects of the present invention.

Figure 6:
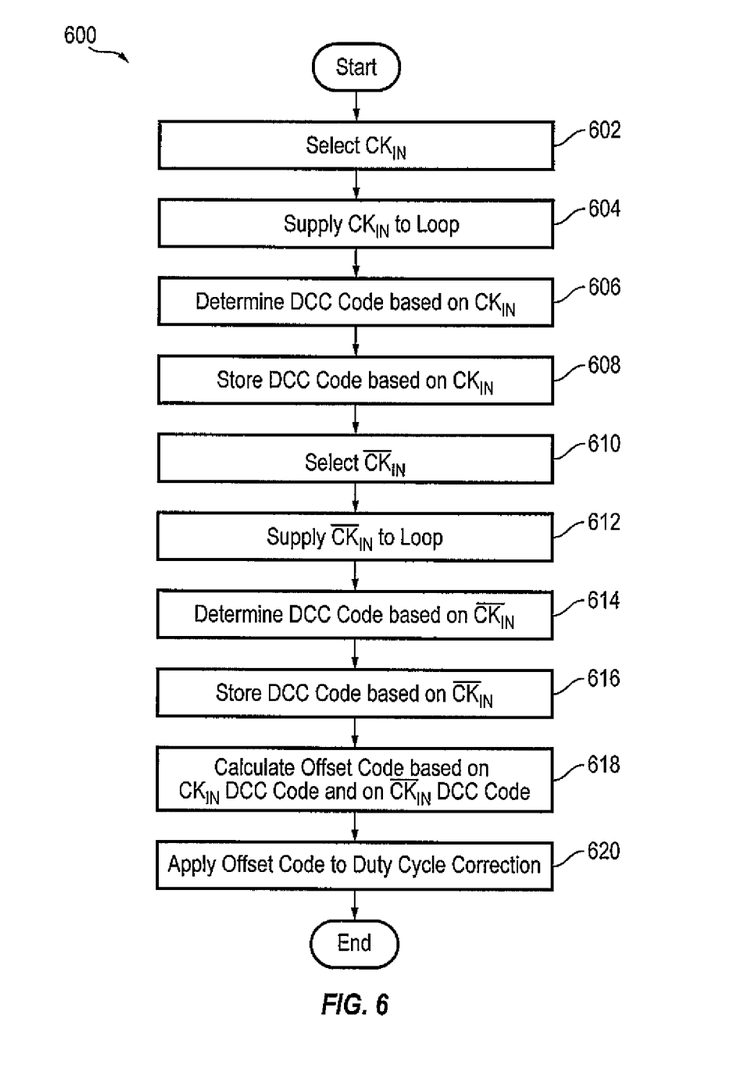
FIG. 6 is a flowchart illustrating a method of duty cycle correction, according to an embodiment of the present invention.

FIG. 6 is a flowchart illustrating a method of duty cycle correction according to an embodiment of the present invention.

Referring to FIG. 6, process 600 includes operation 602, at which the clock signal $CK_{IN}$ is selected. The selection may occur at a multiplexer that allows the clock signal $CK_{IN}$ to pass through. At operation 604, the clock signal $CK_{IN}$ is supplied or transmitted to a duty cycle correction loop. The duty cycle correction loop may be the duty cycle correction loop illustrated in FIG. 3. At operation 606, a DCC code in response to the clock signal $CK_{IN}$ is determined. This operation may occur at a finite state machine. At operation 608, the DCC code corresponding to the clock signal $CK_{IN}$ is stored.

At operation 610, the complementary clock signal $/CK_{IN}$ is selected (e.g., by the multiplexer). At operation 612, the complementary clock signal $/CK_{IN}$ is supplied to the duty cycle correction loop. At operation 614, a DCC code in response to the complementary clock signal $/CK_{IN}$ is determined. At operation 616, the DCC code corresponding to the complementary clock signal $/CK_{IN}$ is stored.

At operation 618, the offset code is calculated based on the DCC code corresponding to the clock signal $CK_{IN}$, and based on the DCC code corresponding to the complementary clock signal $/CK_{IN}$. For example, the average of the two DCC codes may be calculated to determine the offset. At operation 620, the calculated offset code is applied to subsequent duty cycle correction or compensation operations (e.g., the offset is added or subtracted to the subsequent duty cycle correction operations).

Although the above process is illustrated to occur only one time, embodiments of the present invention are not so limited, and the process shown in FIG. 6 may occur any suitable number of times to calculate any suitable number of offset codes.

In embodiments of the present invention including multiple offset code processing operations, all of the resulting offset codes may be averaged at the end in order to obtain a more accurate offset code to apply to subsequent duty cycle correction operations. For example, if the method shown in FIG. 6 occurs 10 times resulting in 10 offset codes, the 10 offset codes may be averaged to obtain an averaged offset code. In other embodiments of the present invention, all of the DCC codes corresponding to the clock signal $CK_{IN}$ may be averaged and all of the DCC codes corresponding to the complementary clock signal $/CK_{IN}$ may be averaged, and then the two averaged DCC codes may be averaged to obtain the averaged offset code.

While the present invention has been described in connection with certain example embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An electronic device comprising:
   a clock configured to transmit a first clock signal and a second clock signal for operation of the electronic device; and
   a duty cycle corrector coupled to the clock to correct a duty cycle of the first and second clock signals, the duty cycle corrector being configured to:
   select the first clock signal;
   assign and store a first duty cycle correction code in response to the first clock signal;
   select the second clock signal after the assigning and storing of the first duty cycle correction code;
   assign and store a second duty cycle correction code in response to the second clock signal;
   calculate an offset code based on the first and second duty cycle correction codes; and
   negate the offset code from results of duty cycle correction operations.

2. The electronic device of claim 1, wherein the duty cycle corrector is further configured to calculate the offset code by averaging the first and second duty cycle correction codes.

3. The electronic device of claim 2, further comprising a multiplexer coupled between the clock and the duty cycle corrector, the multiplexer being configured to selectively output the first clock signal or the second clock signal.

4. The electronic device of claim 3, further comprising a finite state machine configured to control the multiplexer to sequentially output the first clock signal and the second clock signal to the duty cycle corrector.

5. The electronic device of claim 1, wherein the clock is further configured to retransmit the first and second clock signals.

6. The electronic device of claim 5, wherein the duty cycle corrector is further configured to:
assign and store a third duty cycle correction code in response to the retransmitted first clock signal;
assign and store a fourth duty cycle correction code in response to the retransmitted second clock signal;
average the first and third duty cycle correction codes to obtain a first averaged duty cycle correction code;
average the second and fourth duty cycle correction codes to obtain a second averaged duty cycle correction code; and
calculate the offset code based on the first and second averaged duty cycle correction codes.

7. The electronic device of claim 6, wherein the duty cycle corrector is further configured to calculate the offset code by averaging the first and second averaged duty cycle correction codes.

8. The electronic device of claim 1, further comprising a finite state machine, wherein the finite state machine is configured to store therein a plurality of duty cycle correction codes corresponding to respective magnitudes of duty cycle correction.

9. An electronic device comprising:
a clock configured to transmit a first clock signal and a second clock signal for operation of the electronic device;
a duty cycle corrector coupled to the clock to correct a duty cycle of the first and second clock signals, the duty cycle corrector being configured to:
assign and store a first duty cycle correction code in response to the first clock signal;
assign and store a second duty cycle correction code in response to the second clock signal;
calculate an offset code based on the first and second duty cycle correction codes; and
negate the offset code from results of duty cycle correction operations, and
a finite state machine,
wherein the finite state machine is configured to store therein a plurality of duty cycle correction codes corresponding to respective magnitudes of duty cycle correction, and
wherein a relationship between the plurality of the duty cycle correction codes and the magnitudes of duty cycle correction is linear.

10. The electronic device of claim 1, wherein the first clock signal is a complement of the second clock signal.

11. A method of compensating for offset of a duty cycle correction loop, the method comprising:
transmitting a first clock signal to a duty cycle corrector;
transmitting a second clock signal to the duty cycle corrector;
select the first clock signal;
assigning and storing a first duty cycle correction code in response to the first clock signal;
select the second clock signal after the assigning and storing of the first duty cycle correction code;
assigning and storing a second duty cycle correction code in response to the second clock signal;
calculating an offset code based on the first and second duty cycle correction codes; and
negating the offset code from results of duty cycle correction operations.

12. The method of claim 11, wherein the calculating the offset code comprises averaging the first and second duty cycle correction codes.

13. The method of claim 12, wherein the transmitting the first and second clock signals comprises selectively transmitting the first clock signal or the second clock signal.

14. The method of claim 13, wherein the transmitting the first and second clock signals comprises sequentially outputting the first clock signal and the second clock signal to the duty cycle corrector.

15. A method of compensating for offset of a duty cycle correction loop, the method comprising:
transmitting a first clock signal to a duty cycle corrector;
transmitting a second clock signal to the duty cycle corrector;
assigning and storing a first duty cycle correction code in response to the first clock signal;
assigning and storing a second duty cycle correction code in response to the second clock signal;
calculating an offset code based on the first and second duty cycle correction codes; and
negating the offset code from results of duty cycle correction operations;
retransmitting the first clock signal;
retransmitting the second clock signal;
assigning and storing a third duty cycle correction code in response to the retransmitted first clock signal;
assigning and storing a fourth duty cycle correction code in response to the retransmitted second clock signal;
averaging the first and third duty cycle correction codes to obtain a first averaged duty cycle correction code;
averaging the second and fourth duty cycle correction codes to obtain a second averaged duty cycle correction code; and
calculating the offset code based on the first and second averaged duty cycle correction codes.

16. The method of claim 15, wherein the calculating the offset code comprises averaging the first and second averaged duty cycle correction codes.

17. The method of claim 11, wherein a finite state machine is configured to store therein a plurality of duty cycle correction codes corresponding to respective magnitudes of duty cycle correction.

18. The method of claim 17, wherein a relationship between the plurality of the duty cycle correction codes and the magnitudes of duty cycle correction is linear with respect to a mid-point.

19. The method of claim 11, wherein the first clock signal is a complement of the second clock signal.

20. The method of claim 11, wherein the method is performed in an electronic device and is repeated periodically during operation of the electronic device.

* * * * *